(12) United States Patent
Pai et al.

(10) Patent No.: US 8,665,027 B2
(45) Date of Patent: Mar. 4, 2014

(54) AMPLIFIER FOR WIRELESS RECEIVER AND ASSOCIATED METHOD

(75) Inventors: Hung-Chuan Pai, Irvine, CA (US); Shou-Fang Chen, Tustin, CA (US)

(73) Assignee: MStar Semiconductor, Inc., Hsinchu County (TW)

( * ) Notice: Subject to any disclaimer, the term of this patent is extended or adjusted under 35 U.S.C. 154(b) by 26 days.

(21) Appl. No.: 13/346,921

(22) Filed: Jan. 10, 2012

(65) Prior Publication Data

US 2013/0176077 A1    Jul. 11, 2013

(51) Int. Cl.
*H03G 3/10* (2006.01)

(52) U.S. Cl.
USPC .......................................... 330/285; 330/311

(58) Field of Classification Search
USPC .................. 330/285, 311, 296, 310
See application file for complete search history.

(56) References Cited

U.S. PATENT DOCUMENTS

| | | | | |
|---|---|---|---|---|
| 8,120,428 | B2 * | 2/2012 | Montalvo et al. | 330/311 |
| 8,242,847 | B1 * | 8/2012 | Leong et al. | 330/311 |
| 2005/0195039 | A1 * | 9/2005 | Behzad et al. | 330/311 |

OTHER PUBLICATIONS

Srenik Mehta et al., "An 802.11g WLAN SoC", 2005, IEEE International Solid-State Circuits Conference.
Kim et al., "A 100mW Dual-Band CMOS Mobile-TV Tuner IC for T-DMB/DAB and ISDB-T", 2006, IEEE International Solid-State Circuits Conference.
Kim et al., "A 100 mW Dual-Band CMOS Mobile-TV Tuner IC for T-DMB/DAB and ISDB-T", 2006, IEEE International Solid-State Circuits Conference.
Srenik S. Mehta et al., "An 802.11g WLAN SoC", vol. 40, Dec. 2005, IEEE Journal of Solid-State Circuits.
Federico Beffa et al., "A Receiver for WCDMA/EDGE Mobile Phones with Inductorless Front-End in 65nm CMOS", 2011, IEEE International Solid-State Circuits Conference.

* cited by examiner

*Primary Examiner* — Henry Choe
(74) *Attorney, Agent, or Firm* — WPAT, PC; Justin King

(57) ABSTRACT

An amplifier for wireless receivers and an associated method is provided. The amplifier provides an output signal to an output terminal in response to an input signal received from an input terminal, and further includes a first block and a second block. The first block is coupled between the input terminal and the output terminal, and includes a gain control terminal and a first transistor. The gain control terminal is coupled to a gain control signal, while the gain control signal is provided such that the first transistor is kept operating in a triode region, and a gain of the output signal over the input signal can be seamlessly tuned in response to the gain control signal.

16 Claims, 4 Drawing Sheets

AMPLIFIER FOR WIRELESS RECEIVER AND ASSOCIATED METHOD

FIELD OF THE INVENTION

The present invention relates to an amplifier for wireless receiver and associated method, and more particularly, to an amplifier and associated method for implementing seamless gain control and enhanced linearity with a driving transistor kept operating in triode mode (also called linear region).

BACKGROUND OF THE INVENTION

Wireless technology has been broadly adopted for network systems, broadcasting systems, positioning systems, mobile interconnection systems, and communication systems. One of the most important aspects of wireless technology is the use of a wireless receiver for receiving wireless signals. In modern wireless technology, a wireless receiver receives wireless signals with an antenna, amplifies the received signal, mixes the amplified signal with local oscillation signal(s), filters the mixed signal (e.g., by low-pass and/or band-pass filter(s)), and performs analog-to-digital conversion to convert the filtered signal to a digital signal, such that information, data, audio/video streams, packets, and/or messages carried in the original wireless signal can be retrieved by digitally processing the digital signal.

While amplifying the received signal, factors such as noise, bandwidth, gain control ability, and linearity are of main concern. Amplification techniques resulting in low noise, high linearity, and broad bandwidth are demanded to provide good noise figures, low signal distortion, and support of modern modulation schemes (e.g., spread spectrum and/or frequency multiplexing). To fully utilize the dynamic range of analog-to-digital conversion, fine gain control is also required. Magnitude of the received signal varies greatly due to various factors, e.g., deviation of wireless propagation environment/channel and/or distance variation between wireless signal source and the receiver. Different magnitudes of the received signal need to be amplified with different gain, such that magnitude of the amplified signal can match the full dynamic range of the analog-to-digital conversion.

For gain control, a common prior art amplification technique is implemented by two stages of amplifiers; a received signal is first amplified by a low-noise amplifier (LNA), and is then amplified by a variable-gain amplifier (VGA). In the prior art, the low-noise amplifier often implements a step gain control of coarse gain tuning, and the variable-gain amplifier implements a fine gain control. With the step gain control of the LNA, the gain of the LNA is selected from a finite number of different gain levels, so that the gain cannot be fine-tuned to any arbitrary value between any two adjacent gain levels. Consequently, an additional VGA of fine gain control is adopted to fill gaps between the gain levels of the LNA. However, such two stage amplifying architecture occupies a larger physical layout area, consumes more current and power, and also suffers higher noise since more active and/or passive elements are required to implement the amplifying architecture.

SUMMARY OF THE INVENTION

To address the issues and problems of prior art systems, an amplifier (e.g., an LNA) with seamless gain control for amplification of wireless receiver is provided according to the invention. With the seamless gain control, gain of the amplifier can be seamlessly fine-tuned to any arbitrary value within a gain range. Therefore, demands of amplification technique can be satisfied with a single stage amplifier, which enhances linearity, occupies smaller layout area, consumes lower power, and induces less noise.

An objective of the present invention is providing an amplifier for a wireless receiver, including an input terminal, an output terminal, a first block, a second block, and a feedback circuit. The input terminal is for receiving an input signal, and the amplifier is arranged to provide an output signal to the output terminal in response to the input signal. The first block includes a first terminal, a second terminal, and a gain control terminal respectively coupled to the input terminal, the output terminal, and a gain control signal, and further includes a first transistor which operates in a triode region. The second block includes a third terminal and a fourth terminal respectively coupled to the input terminal and the output terminal, and conducts a current at the output terminal in response to the input signal. The feedback circuit is coupled between the input terminal and the output terminal for providing a feedback resistance between the input terminal and the output terminal.

According to an embodiment of the invention, the first block includes the first transistor and a second transistor. The first transistor has a first gate, a first source, and a first drain; the first gate and the first source are respectively coupled to the first terminal and a first supply voltage. The second transistor has a second gate, a second drain, and a second source respectively coupled to the gain control terminal, the second terminal, and the first drain. The second transistor adjusts a voltage at the first drain in response to the gain control signal.

According to an embodiment of the invention, the second block includes a third transistor and a fourth transistor. The third transistor has a third gate, a third source, and a third drain; the third gate and the third source are respectively coupled to the third terminal and a second supply voltage. The fourth transistor has a fourth gate, a fourth source, and a fourth drain respectively coupled to a bias voltage, the third drain and the fourth terminal.

According to an embodiment of the invention, the amplifier is capable of tuning a gain of the output signal over the input signal in response to the gain control signal, such that the gain varies to two different values in response to any two different values of the gain control signal.

An objective of the invention is providing a method for controlling an amplifier which includes an input terminal, an output terminal, a gain control terminal, and a first transistor coupled to the input terminal. The method includes: receiving an input signal from the input terminal and providing an output signal to the output terminal with the amplifier, and providing a gain control signal to the gain control terminal such that the first transistor is kept operating in a triode region.

According to an embodiment of the invention, the method further includes: adjusting the gain control signal for tuning a gain of the output signal over the input signal. The gain control signal can be adjusted from a current value to an arbitrary different value for tuning the gain to a different value.

According to an embodiment of the invention, the first transistor has a first gate and a first drain with the first gate coupled to the input terminal. The amplifier further includes a second transistor with a second gate and a second source respectively coupled to the gain control terminal and the first drain. The method further includes: by providing the gain control signal to the gain control terminal, controlling the second transistor to provide a voltage to the first drain, such that the first transistor is kept operating in the triode region.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
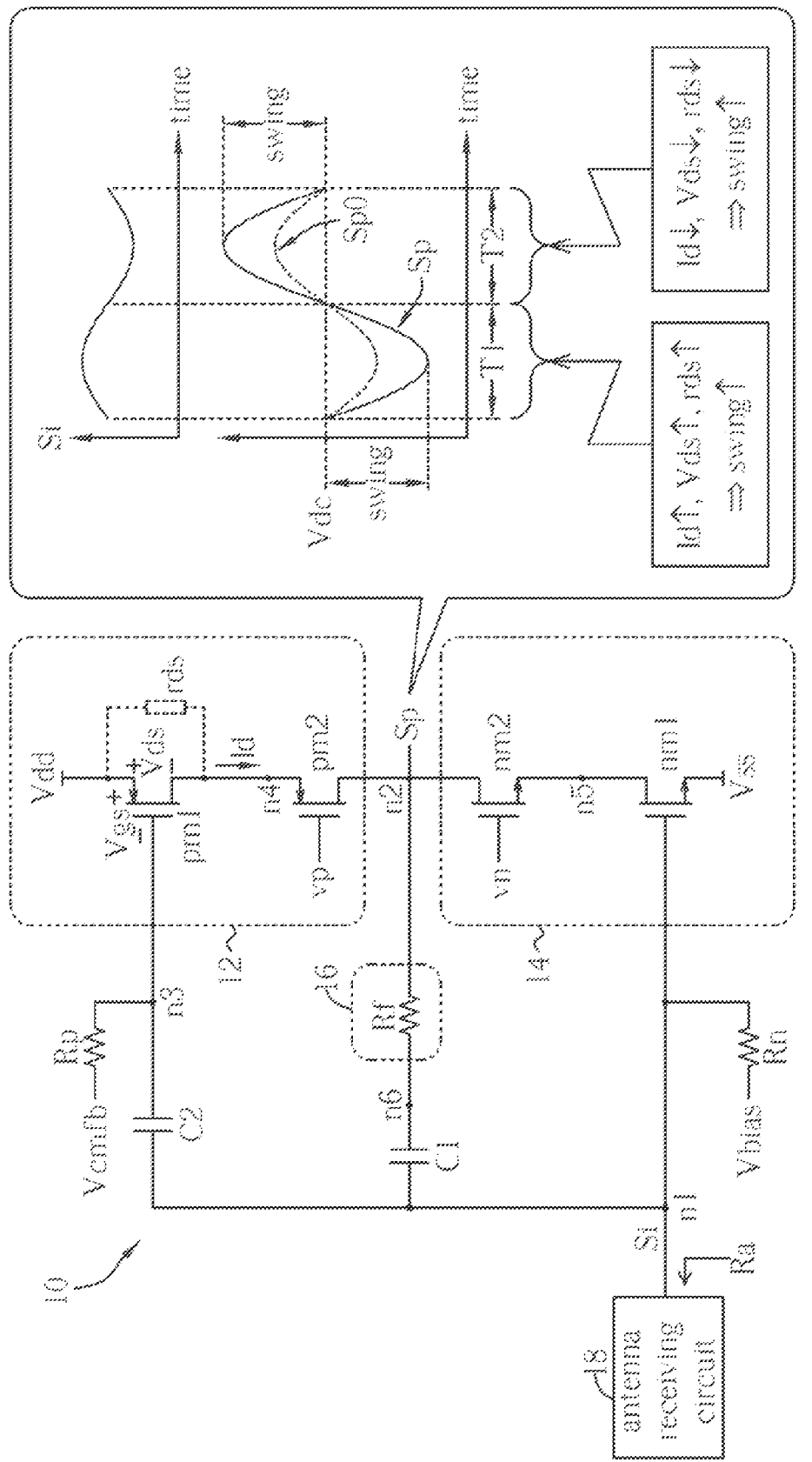
FIG. 1 illustrates an amplifier according to an embodiment of the invention.

Please refer to FIG. 1 illustrating an amplifier 10 according to an embodiment of the invention. The amplifier 10 operates between supply voltages Vdd and Vss; with nodes n1 and n2 respectively as an input terminal and an output terminal. The amplifier 10 receives a signal Si (input signal) from the node n1 and provides a signal Sp (output signal) to the node n2 in response to the signal Si. The amplifier 10, e.g., an LNA, can be implemented in a wireless receiver where wireless signal is received as the signal Si by an antenna receiving circuit 18, and the signal Sp amplified by the amplifier 10 is then outputted to a mixer (not shown). The antenna receiving circuit 18 can include an antenna, transmission line(s), and associated passive and/or active elements, such as resistor(s), inductor(s), capacitor(s), external amplifier(s), filter(s), and/or SAW (surface acoustic wave) element(s). An impedance of the antenna receiving circuit 18 experienced by the amplifier 10 at the node n1 can be modeled by a resistor Ra. To maximized received power of the signal Si, the amplifier 10 can match the resistor Ra for input impedance match.

The amplifier 10 includes two (first and second) blocks 12 and 14, and a feedback circuit 16. The block 12 is coupled between nodes n3 and n2, and includes two transistors pm1 and pm2, e.g., two p-channel metal-oxide-semiconductor field effect transistors (MOSFETs). The node n3 is coupled to the node n1 through a capacitor C2 having AC (Alternating Current) coupling, so the signal Si can be coupled to the node n3. A voltage Vcmfb is also coupled to the node n3 through a resistor Rp to set DC (direct current) bias voltage of the node n3 such that the output node n2 is at the designated DC voltage. A gate, a source, and a drain of the transistor pm1 are respectively coupled to the node n3, the supply voltage Vdd, and a node n4; a gate, a source, and a drain of the transistor pm2 are respectively coupled to a voltage vp, and the nodes n4 and n2. As the gate of the transistor pm2 works as a gain control terminal, the voltage vp is received as a gain control signal.

The block 14 is coupled between the nodes n1 and n2, and includes two transistors nm1 and nm2, e.g., two n-channel MOSFETs. A gate, a source, and a drain of the transistor nm1 are respectively coupled to the node n1, the supply voltage Vss, and a node n5. A gate, a source, and a drain of the transistor nm2 are respectively coupled to a bias voltage vn, the nodes n5 and n2. A voltage Vbias is coupled to the node n1 through a resistor Rn for DC bias of the node n1.

In an embodiment, the transistors nm2 and pm2 can be a pair of complementary transistors, and the transistors nm1 and pm1 can be another pair of complementary transistors. In response to the signal Si, the transistors pm1 and nm1 respectively conduct currents at the nodes n4 and n5; through conduction of the transistors pm2 and nm2, currents at the nodes n4 and n5 are coupled to the node n2, so the signal Sp is driven. Therefore, the transistors nm1 and pm1 form a push-pull topology with the cascode transistors nm2 and pm2. For input impedance match at the node n1, the feedback circuit 16 is arranged between nodes n6 and n2 to provide a feedback resistance by, e.g., a resistor Rf; wherein the node n6 is coupled to the node n1 through a capacitor C2 with AC coupling. With the feedback circuit 16 coupled between input and output terminals of the amplifier 10, the impendence at the node n1 provided by the amplifier 10 is dominated by the resistor Rf; with the feedback circuit 16, input impedance match at the node n1 is satisfied without source degenerated inductors attached to the push-pull topology.

While amplifier of push-pull topology often works with its complementary transistors both operating in saturation region, the transistor pm1 of the amplifier 10 is particularly biased to operate in triode region. With a current Id conducted between source and drain of the transistor pm1, a voltage Vgs across source and gate of the transistor pm1 and a voltage Vds across source and drain of the transistor pm1, if the voltage Vgs is greater than a voltage sum (Vds+Vth), the transistor pm1 is driven to triode region; wherein Vth is an absolute value of a threshold voltage of the transistor pm1. The voltage vp applied to gate of the transistor pm2 is so provided that the transistor pm2 can maintain a proper voltage at the node n4 to keep the transistor pm1 operating in triode region. On the other hand, the transistor nm1 is biased to operate in saturation region.

Figure 2:
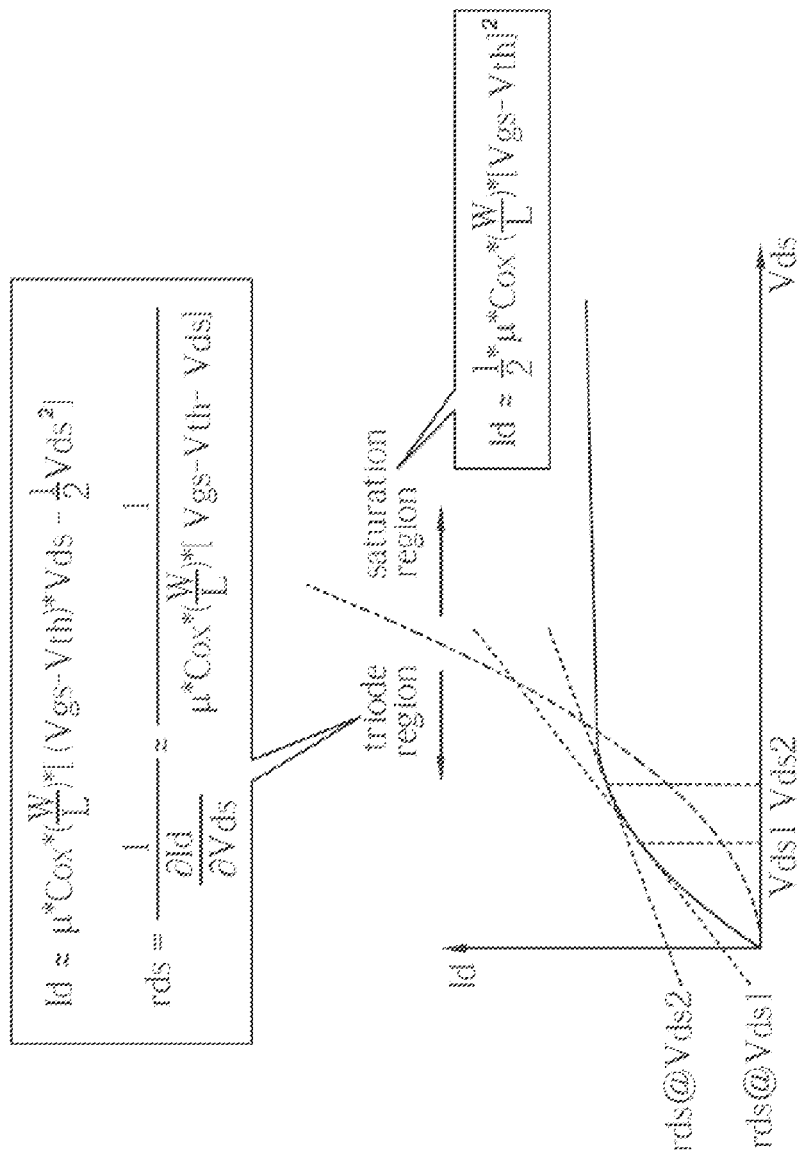
FIG. 2 illustrates an I-V relation of a transistor in the amplifier of FIG. 1.

Please refer to FIG. 2 in association with FIG. 1; FIG. 2 illustrates operation of the transistor pm1 by an I-V relation. In saturation region, the current Id can be approximated by $(\frac{1}{2})*\mu*Cox*(W/L)*[Vgs-Vth]^2$, where $\mu$, Cox and (W/L) are respectively carrier mobility, capacitance per unit area, and an aspect ratio (a ratio of channel width to length) of the transistor pm1. That is, if the transistor pm1 operates in saturation region, the current Id almost keeps constant while the voltage Vds varies. On the other hand, in triode region, the current Id can be approximated by $\mu*Cox*(W/L)*[(Vds-Vth)*Vds-(\frac{1}{2})*(Vgs^2)]$. In triode region, a relation between the current Id and the voltage Vds (a reciprocal of a slope of the I-V curve) can be approximated by a resistor rds between drain and source of the transistor pm1 (also denoted in FIG. 1), and resistance of the resistor rds varies as the voltage Vds varies. For example, as shown in FIG. 2, for the voltage Vds of a value Vds2 greater than a value Vds1, the resistor rds is of a corresponding resistance rds@Vds2 greater than a resistance rds@Vds1.

Please refer to FIG. 1 again for waveforms of the signals Si and Sp; according to the invention, characteristics of triode region are adopted to enhance linearity of the amplifier 10. During an interval T1 when the input signal Si rises with an upward swing, amount of the current Id, the voltage Vds and resistance of the resistor rds all increase in response; therefore, a downward swing against a constant DC voltage Vdc of the signal Sp is extended farther comparing to that of a signal Sp0, wherein the signal Sp0, shown by a dashed waveform, is the output signal at the node n2 assuming the transistor pm1 operates in saturation region.

While the signal Si falls with a downward swing during an interval T2, the current Id, the voltage Vds and resistance of the resistor rds decrease in response, and an upward swing range of the signal Sp is also enlarged comparing to that of the signal Sp0. That is, by driving the transistor pm1 to operate in triode region instead of saturation region, headroom for voltage swing at the node n2 expands for enhanced linearity.

While keeping the transistor pm1 operating in triode region, the bias voltage vp also provides seamless gain control for the gain of the output signal Sp over the input signal Si. Please refer to FIG. 3 for gain control and linearity improvement according to an embodiment of the invention. The gain control is demonstrated by gain variation in response to the voltage vp, and linearity enhancement is demonstrated by IIP3 (third order interception point) increasing in response to the voltage vp. It is noticed that by setting the voltage vp to different value, the gain can be changed to any arbitrary value in the gain range, rather than finite number of discrete gain levels; and seamless gain control is therefore achieved. That is, the voltage vp can be adjusted from a current value to an arbitrary different value for tuning the gain to a different value.

An automatic gain control can be implemented with the amplifier 10. Input power (power of the signal Si) information can be obtained from RSSI (Received Signal Strength Indication) and/or peak detection, and then be used to control the voltage vp. In an embodiment, the gain control of the voltage vp implements a fine, seamless gain control, while other controllable parameter(s) of the amplifier 10, e.g., DC bias voltage at one or more selected nodes and/or resistance provided by the feedback circuit 16, can be used to implement a coarse, step-wise gain control. For example, the resistor Rf in the feedback circuit 16 can be a variable resistor with a resistance selected from a number of different resistance alternatives, thus different gain levels can be implemented when the feedback circuit 16 is switched to different resistance alternatives; and the seamless gain control of the voltage vp is used to fill gap between every two adjacent gain levels.

Figure 3:
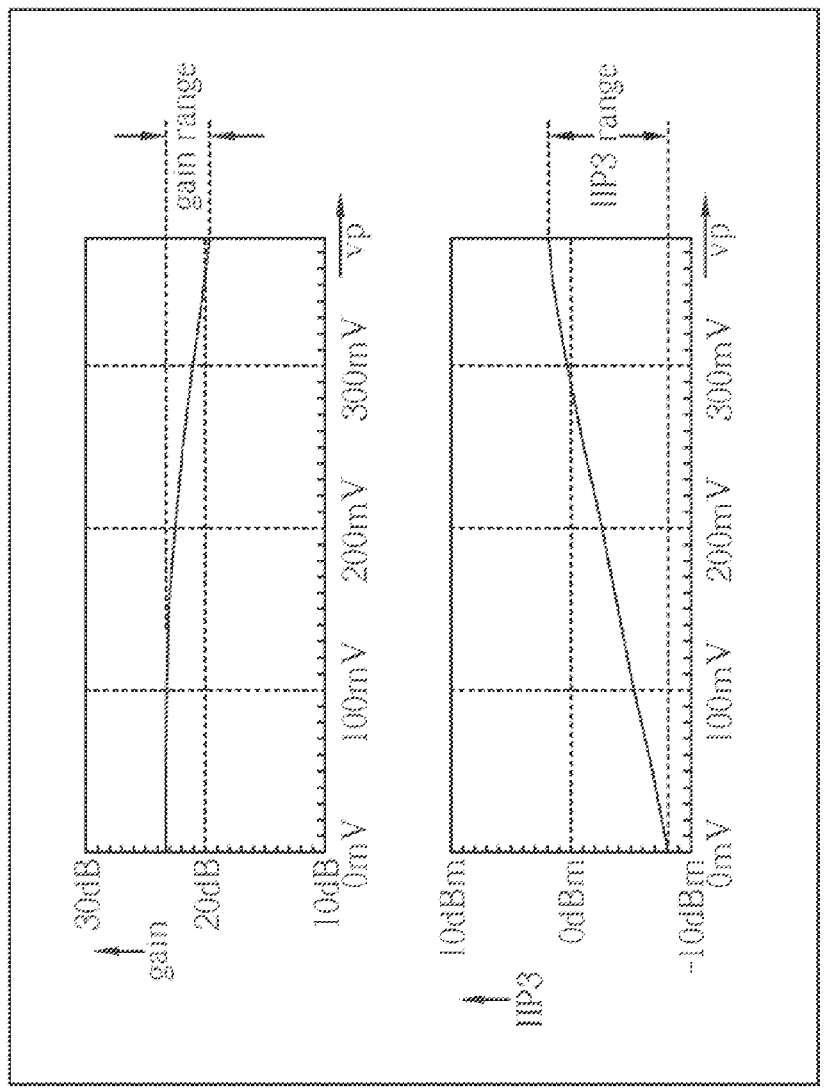
FIG. 3 illustrates seamless gain control and linearity enhancement of the amplifier shown in FIG. 2.

From FIG. 3, it is also recognized that linearity improvement (IIP3 range) is greater than the gain range over a same variation of the voltage vp. That is, gain drop in the gain range is not the only reason for linearity improvement; driving the transistor pmt to triode region contributes additional increment of linearity.

Figure 4:
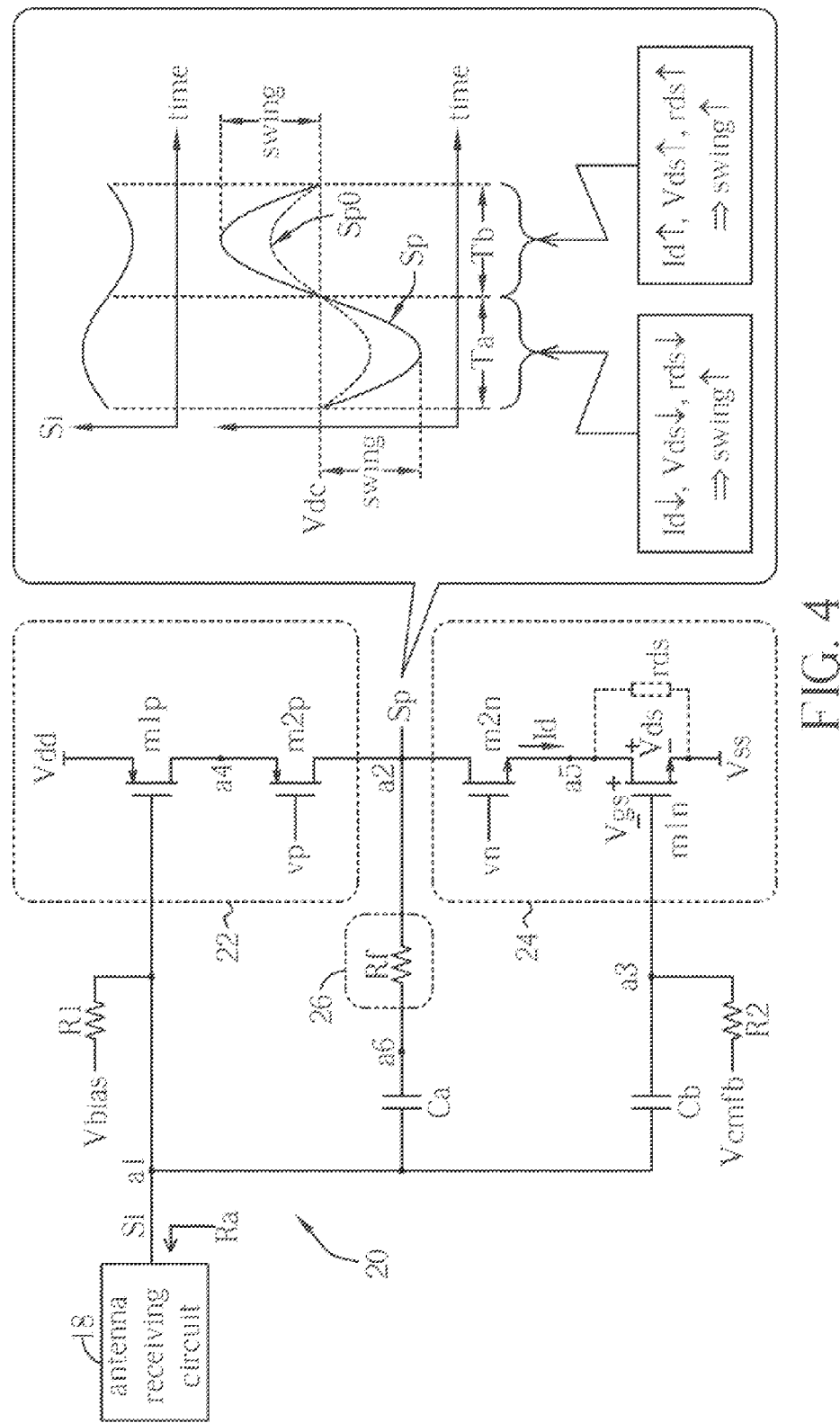
FIG. 4 illustrates an amplifier according to another embodiment of the invention.

Please refer to FIG. 4 illustrating an amplifier 20 according to an embodiment of the invention. Similar to the amplifier 10, the amplifier 20 can be included in an RF (Radio Frequency) analog frontend of a wireless receiver as an LNA, so as to amplify the signal Si of the antenna receiving circuit 18 and provide the amplified signal Sp to, e.g., a mixer (not shown). With two nodes a1 and a2 respectively as input and output terminals, the amplifier 20 includes two blocks 22 and 24, and a feedback circuit 26, and operates between the supply voltages Vdd and Vss.

The block 24 includes two transistors (e.g., two n-channel MOSFETs) m1n and m2n, respectively complementary to two transistors (e.g., two p-channel MOSFETs) m1p and m2p in the block 26; while the transistor m1p is biased to operate in saturation region, the transistor m1n is biased to operate in triode region.

The block 24 is coupled between the nodes a3 and a2. A gate, a source and a drain of the transistor m1n are respectively coupled to the node a1, the supply voltage Vss and a node a5; a gate, a source, and a drain of the transistor m2n are respectively coupled to a bias voltage vn, and the nodes a5 and a2. As a gain control signal, the bias voltage vn is so provided that the transistor m2n can provide a proper voltage at the node a5 to keep the transistor m1n operating in triode region. That is, a voltage Vgs between source and gate of the transistor m1n is greater than a voltage sum (Vds+Vth_n), wherein Vds is a voltage between drain and source of the transistor m1n, and Vth_n is threshold voltage of the transistor m1n. The node a3 is coupled to the node a1 through a capacitor Cb with AC coupling, and a voltage Vcmfb is coupled to the node a3 through a transistor R2 for setting DC bias of the node a3 such that the output node a2 is at the designated DC voltage.

The block 22 is coupled between the nodes a1 and a2; a gate, a source and a drain of the transistor m1p are respectively coupled to the node a1, the supply voltage Vdd and a node a4, and a gate, a source, and a drain of the transistor m2p are respectively coupled to a bias voltage vp, and the nodes a4 and a2. A voltage Vbias is coupled to the node a1 through a resistor R1 for setting DC bias of the node a1. The feedback circuit 26 is coupled between nodes a6 and a2, and provides a feedback resistance by a resistor Rf. The node a6 is coupled to the node a1 through a capacitor Ca having AC coupling.

The amplifier 20 also implements seamless gain control and enhanced linearity by driving the transistor m1n to triode region. As waveforms of the signals Si and Sp show, during an interval Ta when the signal Si rises with an upward swing, a current Id conducted between source and drain of the transistor m1n, the voltage Vds and a resistor rds between source and drain of the transistor m1n all decrease, so the signal Sp can have a deeper downward swing, comparing to a signal Sp0 assuming the transistor m1n operates in saturation region. During an interval Tb, when the signal Si falls with a downward swing, the current Id, the voltage Vds, and the resistor rds increase, therefore the signal Sp can have a higher upward swing.

A method controlling the amplifiers 10 and 20 of the invention is provided; while one of the complementary driving transistors (e.g., the transistors pm1 and nm1) in the push-pull topology operates in saturation region, the other one is kept operating in triode region by a proper gain control signal (the voltage vp in FIG. 1 and the voltage vn in FIG. 4) provided to a gate of a cascode transistor which is coupled to the driving transistor operating in triode region. Seamless gain control can be implemented by adjusting the gain control signal for tuning a gain of the output signal over the input signal. The gain control signal can be adjusted from a current value to an arbitrary different value for tuning the gain to a different value, as shown in FIG. 3.

To sum up, comparing to prior art, the amplifier of the invention readily implements seamless gain control with a simple architecture of a single amplifier instead of complicated, noise-sensitive, power and area consuming two stages of amplifiers; furthermore, the amplifier of the invention expands headroom for output swing, so linearity performance is also enhanced. As the amplifier of the invention is adopted for broadband amplification in RF analog frontend of a wireless receiver, the wireless receiver will benefit from lowered power consumption, smaller layout area, higher linearity and eventually better receiving quality (e.g., lower bit error rate).

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An amplifier for a wireless receiver, comprising:
an input terminal, for receiving an input signal;
an output terminal, for outputting an output signal in response to the input signal;
a first block comprising a first terminal, a second terminal, and a gain control terminal respectively coupled to the input terminal, the output terminal, and a gain control signal, and further comprising a first transistor which continually operates in a triode region;
a second block comprising a third terminal and a fourth terminal respectively coupled to the input terminal and the output terminal, and conducting a current at the output terminal; a capacitor connecting to said first terminal via a node, and positioned between said node and the input terminal; and
a resistor connecting to said first terminal via said node;
wherein a first supply voltage is coupled to said node via said resistor.

2. The amplifier as claimed in claim 1, further comprising:
a feedback circuit coupled between the input terminal and the output terminal for providing a feedback resistance between the input terminal and the output terminal.

3. The amplifier as claimed in claim 1, wherein the first transistor comprises a first gate and a first source respectively coupled to the first terminal and a first supply voltage.

4. The amplifier as claimed in claim 3, wherein the first transistor further comprises a first drain, and the first block further comprises:
a second transistor comprising a second gate, a second drain, and a second source respectively coupled to the gain control terminal, the second terminal, and the first drain;
wherein the second transistor adjusts a voltage at the first drain in response to the gain control signal.

5. The amplifier as claimed in claim 1, wherein the second block comprises:
a third transistor comprising a third gate and a third source respectively coupled to the third terminal and a second supply voltage.

6. The amplifier as claimed in claim 5, wherein the third transistor further comprises a third drain, and the second block further comprises:
a fourth transistor comprising a fourth gate, a fourth source, and a fourth drain respectively coupled to a bias voltage, the third drain and the fourth terminal.

7. The amplifier as claimed in claim 1, further configured for tuning a gain of the output signal over the input signal in response to the gain control signal, such that the gain varies to two different values in response to any two different values of the gain control signal.

8. An amplifier for a wireless receiver, comprising:
an input terminal, for receiving an input signal;
an output terminal, for outputting an output signal in response to the input signal;
a first block comprising a first terminal coupled to the input terminal, a second terminal coupled to the output terminal, and a gain control terminal coupled to a gain control signal, a first voltage source, and a first transistor which continually operates in a triode region;
a second block comprising a third terminal coupled to the input terminal, a fourth terminal coupled to the output terminal, a second voltage source;
wherein the second block is conducting a current at the output terminal; a capacitor connecting to said first terminal via a node, and positioned between said node and the input terminal; and
a resistor connecting to said first terminal via said node;
wherein a first supply voltage is coupled to said node via said resistor.

9. The amplifier as claimed in claim 8, further comprising:
a feedback circuit coupled directly between the input terminal and the output terminal for providing a feedback resistance between the input terminal and the output terminal.

10. The amplifier as claimed in claim 8, wherein the first transistor comprises a first gate coupled to the first terminal and a first source coupled to a first supply voltage via the first voltage source.

11. The amplifier as claimed in claim 10, wherein the first transistor further comprises a first drain, and the first block further comprises:
a second transistor comprising a second gate, a second drain, and a second source respectively coupled to the gain control terminal, the second terminal, and the first drain;
wherein the second transistor adjusts a voltage at the first drain in response to the gain control signal.

12. The amplifier as claimed in claim 8, wherein the second block comprises:
a third transistor comprising a third gate coupled to the third terminal and a third source coupled to a second supply voltage via the second voltage source.

13. The amplifier as claimed in claim 12, wherein the third transistor further comprises a third drain, and the second block further comprises:
a fourth transistor comprising a fourth gate, a fourth source, and a fourth drain respectively coupled to a bias voltage, the third drain and the fourth terminal.

14. The amplifier as claimed in claim 8, further configured for tuning a gain of the output signal over the input signal in response to the gain control signal, such that the gain varies to two different values in response to any two different values of the gain control signal.

15. The amplifier as claimed in claim 8, wherein the first voltage source is larger than the second voltage source.

16. The amplifier as claimed in claim 8, wherein the first voltage source is smaller than the second voltage source.

* * * * *